US010433435B2

United States Patent
Huang et al.

(10) Patent No.: US 10,433,435 B2
(45) Date of Patent: Oct. 1, 2019

(54) SEMICONDUCTOR DEVICE, RELATED MANUFACTURING METHOD, AND RELATED ELECTRONIC DEVICE

(71) Applicants: Semiconductor Manufacturing International (Shanghai) Corporation, Shanghai (CN); NINGBO SEMICONDUCTOR INTERNATIONAL CORPORATION, Ningbo (CN)

(72) Inventors: Herb He Huang, Shanghai (CN); Clifford Ian Drowley, Shanghai (CN); Hai Ting Li, Shanghai (CN)

(73) Assignees: Semiconductor Manufacturing International (Shanghai) Corporation, Shanghai (CN); NINGBO SEMICONDUCTOR INTERNATIONAL CORPORATION, Ningbo (CN)

( * ) Notice: Subject to any disclaimer, the term of this patent is extended or adjusted under 35 U.S.C. 154(b) by 0 days.

(21) Appl. No.: 15/261,471

(22) Filed: Sep. 9, 2016

(65) Prior Publication Data

US 2016/0381811 A1 Dec. 29, 2016

Related U.S. Application Data

(62) Division of application No. 14/566,357, filed on Dec. 10, 2014, now Pat. No. 9,449,950.

(30) Foreign Application Priority Data

Apr. 10, 2014 (CN) .......................... 2014 1 0143547

(51) Int. Cl.
*H01L 21/768* (2006.01)
*H05K 3/46* (2006.01)
(Continued)

(52) U.S. Cl.
CPC ..... *H05K 3/4685* (2013.01); *H01L 21/76898* (2013.01); *H01L 23/481* (2013.01);
(Continued)

(58) Field of Classification Search
CPC .................... H01L 23/5226; H01L 21/76805
See application file for complete search history.

(56) References Cited

U.S. PATENT DOCUMENTS

7,115,498 B1 10/2006 Adem
7,602,599 B1 10/2009 Hsu
(Continued)

*Primary Examiner* — Shaun M Campbell
*Assistant Examiner* — Suberr L Chi
(74) *Attorney, Agent, or Firm* — Anova Law Group, PLLC (57) ABSTRACT

A semiconductor device may include the following elements: a first substrate; a second substrate; a dielectric layer, which may be positioned between the first substrate and the second substrate and may have a hole; a first conductive member, which may be positioned in the dielectric layer; a second conductive member, which may be positioned in the dielectric layer, may be spaced from the first conductive member, and may be positioned closer to the second substrate than the first conductive member; and a third conductive member, which may contact both the first conductive member and the second conductive member through the hole.

11 Claims, 7 Drawing Sheets

(51) Int. Cl.
*H01L 25/065* (2006.01)
*H01L 23/48* (2006.01)
*H01L 25/00* (2006.01)
*H01L 23/58* (2006.01)

(52) U.S. Cl.
CPC .......... *H01L 23/58* (2013.01); *H01L 25/0657* (2013.01); *H01L 25/50* (2013.01); *H01L 2225/06541* (2013.01); *H01L 2924/0002* (2013.01)

(56) References Cited

U.S. PATENT DOCUMENTS

| | | |
|---|---|---|
| 8,058,730 B2 | 11/2011 | Wada et al. |
| 2002/0163072 A1 | 11/2002 | Gupta et al. |
| 2005/0282382 A1* | 12/2005 | Ko .................... H01L 21/02126 438/637 |
| 2013/0299994 A1* | 11/2013 | Park ................. H01L 21/76883 257/774 |
| 2014/0264682 A1 | 9/2014 | Cuang et al. |
| 2015/0137377 A1 | 5/2015 | Bao et al. |
| 2015/0179613 A1* | 6/2015 | Tsai .................. H01L 21/76898 257/773 |
| 2015/0206844 A1* | 7/2015 | Pham ............... H01L 21/76831 257/384 |
| 2015/0249038 A1* | 9/2015 | Xu .................... H01L 23/53223 257/751 |

\* cited by examiner

SEMICONDUCTOR DEVICE, RELATED MANUFACTURING METHOD, AND RELATED ELECTRONIC DEVICE

CROSS-REFERENCE TO RELATED APPLICATION

This is a divisional application of U.S. application Ser. No. 14/566,357 filed on 10 Dec. 2014, which claims priority to and benefit of Chinese Patent Application No. 201410143547.7, filed on 10 Apr. 2014, the disclosures of which are incorporated herein by their reference.

BACKGROUND OF THE INVENTION

The present invention is related to a semiconductor device, a method for manufacturing the semiconductor device, and an electronic device that includes the semiconductor device.

An electronic device may include various components and/or modules. For example, a mobile phone may include one or more of an image signal processor (ISP), a back-illuminated sensor (BSI), a radio frequency front end module system on chip (RF FEM SOC), a nonvolatile memory (NVM), etc. Some the components and modules may include semiconductor devices having three-dimensional integrated circuits (3D ICs) that include interconnected semiconductor device elements that are included in different layers of circuits.

Via members for connecting elements of different layers may be substantially long and may respectively extend through separated vias. Therefore, the semiconductor device may have significant parasitic issues, such as additional RC delay and/or parasitic capacitance, which may undesirably affect the performance of the semiconductor device.

SUMMARY

An embodiment of the present invention may be related to a semiconductor device. The semiconductor device may include the following elements: a first substrate (e.g., a first semiconductor substrate); a second substrate (e.g., a second semiconductor substrate); a dielectric layer, which may be positioned between the first substrate and the second substrate and may have a hole; a first conductive member, which may be positioned in the dielectric layer; a second conductive member, which may be positioned in the dielectric layer, may be spaced from the first conductive member, and may be positioned closer to the second substrate than the first conductive member; and a third conductive member, which may directly contact both the first conductive member and the second conductive member through the hole.

Each of the first conductive member and the second conductive member may extend parallel to the second substrate. At least one of the first conductive member and the second conductive member may include an aluminum (Al) portion.

The third conductive member may extend perpendicular to the second substrate. The third conductive member may include at least one of a copper (Cu) portion and a tungsten (W) portion.

The third conductive member may extend through an insulating portion of the first substrate.

A first side (e.g., a first bottom side) of the third conductive member may directly contact the first conductive member. A second side (e.g., a second bottom side) of the third conductive member may directly contact the second conductive member. A third side (e.g., a lateral side) of the third conductive member may be positioned inside the dielectric layer and may be directed connected to each of the first side of the third conductive member and the second side of the third conductive member.

A length of the third side of the third conductive member may be less than a total length of the third conductive member in a direction perpendicular to the second substrate (e.g., the bottom surface of the second substrate opposite the first substrate).

The first side of the third conductive member may directly contact a first side of the first conductive member. The third side of the third conductive member may directly contact a second side of the first conductive member.

The third conductive member may include a conductive material portion and a diffusion barrier. The conductive material portion may be formed of a first conductive material (e.g., at least one of copper, tungsten, and/or one or more other suitable materials). The diffusion barrier may be formed of a second conductive material (e.g., tantalum nitride and/or one or more other suitable materials) different from the first conductive material. The diffusion barrier may be positioned between the conductive material portion and at least one of the first conductive member and the second conductive member.

The first conductive member may include a conductive material portion and an etch-stop layer. The conductive material portion may be formed of a first conductive material (e.g., aluminum and/or one or more other suitable materials). The etch-stop layer may be formed of a second conductive material (e.g., tantalum nitride and/or one or more other suitable materials) different from the first conductive material. The etch-stop layer may be positioned between the conductive material portion and the first substrate.

The third conductive member may directly contact both the conductive material portion and the etch-stop layer.

The etch-stop layer may be positioned between the conductive material portion and a portion of the third conductive member.

The second conductive member may include a conductive material portion and an etch-stop layer. The conductive material portion may be formed of a first conductive material (e.g., aluminum and/or one or more other suitable materials). The etch-stop layer may be formed of a second conductive material (e.g., tantalum nitride and/or one or more other suitable materials) different from the first conductive material. The etch-stop layer may be positioned between the conductive material portion and the third conductive member.

The third conductive member may include a metal portion and a diffusion barrier. The diffusion barrier may be positioned between the metal portion and the etch-stop layer.

An embodiment of the invention may be related to a method for manufacturing a semiconductor device. The method may include the following steps: preparing a first substrate, which may include an insulating layer; preparing a second substrate; providing a first dielectric layer on the first substrate, wherein a first conductive member may be positioned in the first dielectric layer; providing a second dielectric layer on the second substrate, wherein a second conductive member may be positioned in the second dielectric layer; bonding the first dielectric layer and the second dielectric layer to each other to form a combined dielectric layer; forming a hole in the combined dielectric layer, such that the hole exposes a portion of the first conductive member and exposes a portion of the second conductive member; and providing at least a conductive material in the hole to form a third conductive member, such that the third conductive member may directly contact both the portion of the first conductive member and the portion of the second conductive member through the hole.

A first side of the third conductive member may directly contact the first conductive member. A second side of the third conductive member may directly contact the second conductive member. A third side of the third conductive member may be positioned inside the combined dielectric layer and may be directed connected to each of the first side of the third conductive member and the second side of the third conductive member.

A length of the third side of the third conductive member may be less than a total length of the third conductive member in a direction perpendicular to the second substrate.

The first side of the third conductive member may directly contact a first side of the first conductive member. The third side of the third conductive member may directly contact a second side of the first conductive member.

The method may include providing a diffusion barrier material (e.g., tantalum nitride and/or one or more other suitable materials) in the hole to form a diffusion barrier. The conductive material (e.g., at least one of copper, tungsten, and/or one or more other suitable materials) may be subsequently provided to form a conductive material portion. The third conductive member may include the conductive material portion and the diffusion barrier.

The method may include forming the first conductive member such that the first conductive member may include the first conductive member a conductive material portion and an etch-stop layer. The conductive material portion may be formed of a first conductive material (e.g., aluminum and/or one or more other suitable materials). The etch-stop layer may be formed of a second conductive material (e.g., tantalum nitride and/or one or more other suitable materials) different from the first conductive material. The etch-stop layer may be positioned between the conductive material portion and the first substrate after the bonding.

The third conductive member may be formed to contact both the conductive material portion and the etch-stop layer.

The third conductive member may be formed such that the etch-stop layer may be positioned between the conductive material portion and a portion of the third conductive member.

The method may include forming the second conductive member such that the second conductive member may include a conductive material portion and an etch-stop layer. The conductive material portion may be formed of a first conductive material (e.g., aluminum and/or one or more other suitable materials). The etch-stop layer may be formed of a second conductive material (e.g., tantalum nitride and/or one or more other suitable materials) different from the first conductive material. The third conductive member may be formed such that the third conductive member may include a diffusion barrier and such that the etch-stop layer may be positioned between the conductive material portion and the diffusion barrier.

An embodiment of the invention may be related to an electronic device may include one or more features of the aforementioned semiconductor device and/or may include a semiconductor device manufactured using one or more steps of the aforementioned method.

According to embodiments of the invention, in a semiconductor device, two separated horizontal conductive members may be electrically connected to other elements through a single vertical conductive member, rather than through two spaced vertical conductive members. Therefore, parasitic issues in the semiconductor device may be minimized or substantially prevented. Advantageously, the performance of the semiconductor device (and a related electronic device) may be substantially satisfactory.

The above summary is related to one or more of many embodiments of the invention disclosed herein and is not intended to limit the scope of the invention.

BRIEF DESCRIPTION OF THE DRAWINGS

FIG. 5 shows a flowchart that illustrates a method for manufacturing a semiconductor device in accordance with one or more embodiments of the present invention.

DETAILED DESCRIPTION

Example embodiments of the present invention are described with reference to the accompanying drawings. As those skilled in the art would realize, the described embodiments may be modified in various different ways, all without departing from the spirit or scope of the present invention. Embodiments of the present invention may be practiced without some or all of these specific details. Well known process steps and/or structures may not have been described in detail in order to not unnecessarily obscure the present invention.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting the present invention. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may also be present between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the invention. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art related to this invention. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive"

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments of the invention may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

Figure 1:
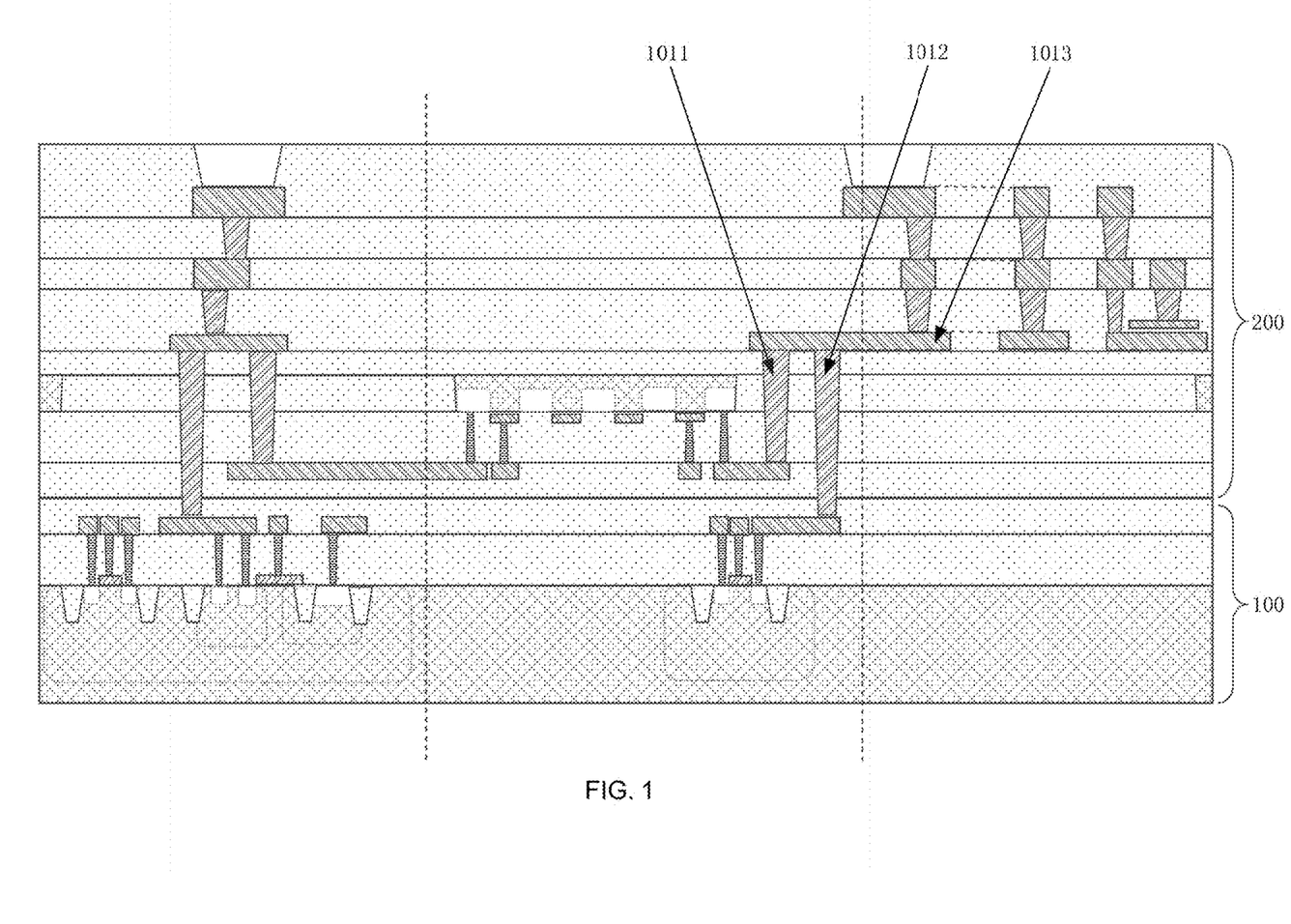
FIG. 1 shows a schematic cross-sectional view that illustrates elements and structures of a semiconductor device in accordance with one or more embodiments of the present invention.

FIG. 1 shows a schematic cross-sectional view that illustrates elements and structures of a semiconductor device in accordance with one or more embodiments of the present invention. The semiconductor device may include a first chip 100 (or first circuit layer 100) and a second chip 200 (or second circuit layer 200) that overlap each other. Elements of the first chip 100 may be connected to elements of the second chip 200 through a first via member 1011, a second via member 1012, and a horizontal interconnect 1013 that is electrically connected to each of the first via member 1011 and the second via member 1012.

Figure 2:
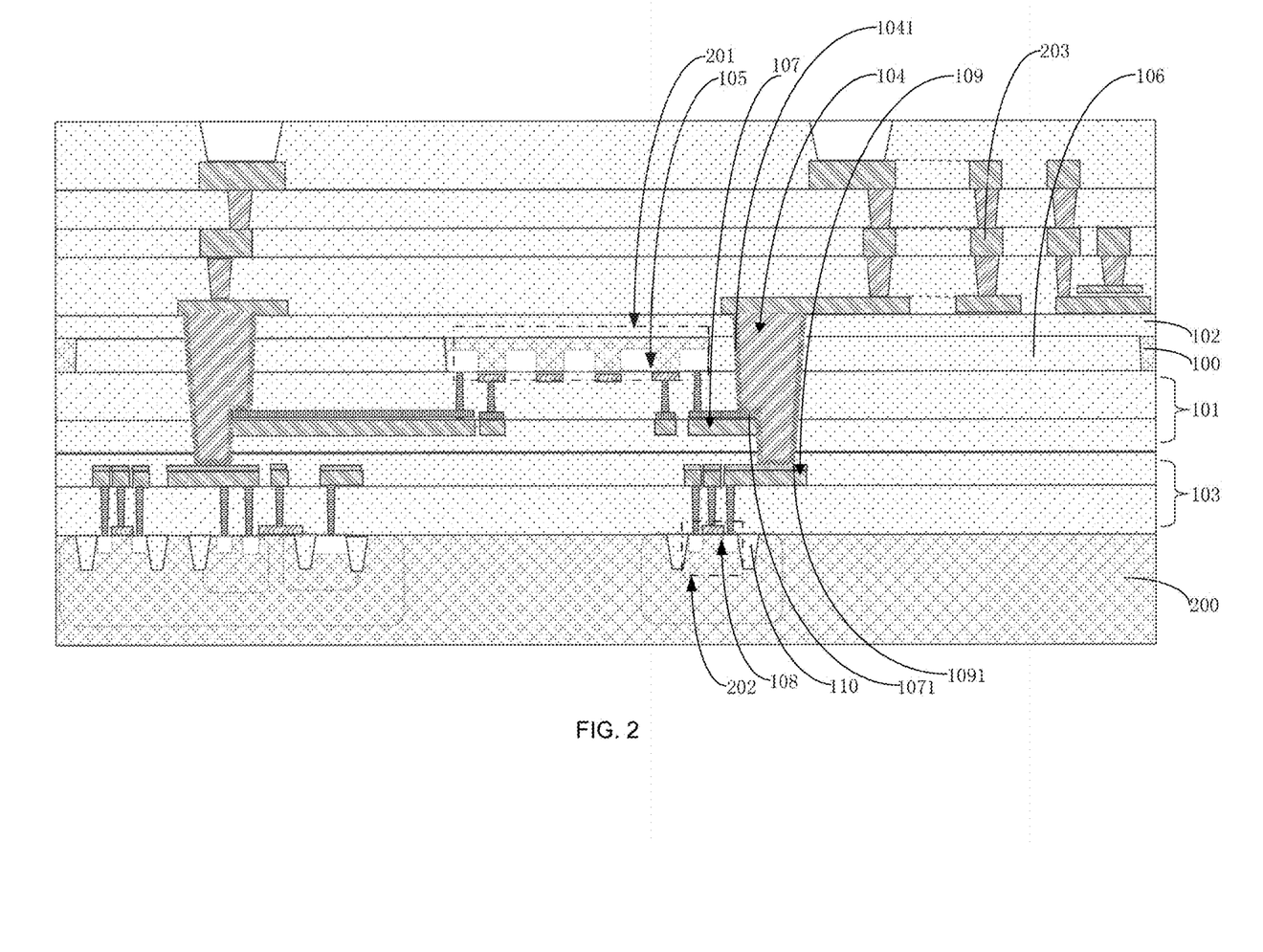
FIG. 2 shows a schematic cross-sectional view that illustrates elements and structures of a semiconductor device in accordance with one or more embodiments of the present invention.

FIG. 2 shows a schematic cross-sectional view that illustrates elements and structures of a semiconductor device in accordance with one or more embodiments of the present invention. As illustrated in FIG. 2, the semiconductor device may include the following elements: a first substrate 100 (e.g., a first semiconductor substrate associated with a first chip); a second substrate 200 (e.g., a second semiconductor substrate associated with a second chip); a dielectric layer (e.g., a combination of a first dielectric layer 101 and a second dielectric layer 103), which may be positioned between the first substrate 100 and the second substrate 200 and may have a hole; a first conductive member 107, which may be positioned in the dielectric layer; a second conductive member 109, which may be positioned in the dielectric layer, may be spaced from the first conductive member 107, and may be positioned closer to the second substrate 200 than the first conductive member 107; and a third conductive member 104, which may directly contact both the first conductive member 107 and the second conductive member 109 through the hole.

The first substrate 100 may include a first monocrystalline silicon portion. The first substrate 100 may include a first insulating member 106 (which may abut the first monocrystalline silicon portion) and a first P-N junction set 105 (which may be positioned between two portions of the first insulating member 106). The semiconductor device may include a third dielectric layer 102, wherein the first substrate 100 may be positioned between the first dielectric layer 101 and the third dielectric layer 102. The first P-N junction set 105 may form at least part of a first field-effect transistor set 201. Lateral sides of the first field-effect transistor set 201 may be insulated by the first insulating member 106.

The second substrate 200 may include a second monocrystalline silicon portion. The second substrate 200 may include a second insulating member 110 (which may abut the second monocrystalline silicon portion) and a second P-N junction set 108 (which may be positioned between two portions of the second insulating member 110). The second P-N junction set 108 may form at least part of a second field-effect transistor set 202. Lateral sides of the second field-effect transistor set 202 may be insulated by the second insulating member 110.

At least one of the first dielectric layer 101, the second dielectric layer 103, and the third dielectric layer 102 may be formed of a silicon-containing dielectric material. The first dielectric layer 101 may have a multi-layer structure, wherein the first conductive member 107 may be positioned between adjacent layers of the first dielectric layer 101. The second dielectric layer 103 may have a multi-layer structure, wherein the second conductive member 109 may be positioned between adjacent layers of the second dielectric layer 103.

Each of the first conductive member 107 and the second conductive member 109 may extend parallel to the second substrate 200. At least one of the first conductive member 107 and the second conductive member 109 may include an aluminum (Al) portion.

The third conductive member 104 may extend perpendicular to the second substrate 200. The third conductive member 104 may include at least one of a copper (Cu) portion and a tungsten (W) portion.

The third conductive member 104 may extend through the first insulating member 106. A first portion of the third conductive member 104 (e.g., a left portion of the member 104 shown in FIG. 2) may be positioned inside the first dielectric layer 101 and may directly contact the first conductive member 107. A second portion of the third conductive member 104 (e.g., a right portion of the member 104 shown in FIG. 2) may extend through the first dielectric layer 101 into the second dielectric layer 103 and may directly contact the second conductive member 109. Both the first and second portions of the third conductive member 104 may be positioned in a hole of the combined dielectric layer that includes the dielectric layers 101 and 103. The third conductive member 104 may contact both the first conductive member 107 and the second conductive member 109 through the same hole.

The third conductive member 104 may extend through the third dielectric layer 102 and may directly contact one or more conductive members that are positioned on the third dielectric layer 102.

In an embodiment, the third conductive member 104 may extend into an integrated dielectric layer that includes the third dielectric layer 102 and may directly contact one or more conductive members (e.g., the interconnect structure 203) positioned inside the integrated dielectric layer.

A first side of the third conductive member 104 (e.g., a relatively higher bottom side of the member 104 illustrated in FIG. 2) may directly contact the first conductive member 107. A second side of the third conductive member 104 (e.g., a relatively lower bottom side of the member 104 illustrated in FIG. 2) may directly contact the second conductive member 109. A third side (e.g., a lateral side) of the third conductive member 104 may be positioned inside the dielectric layer and may be directed connected to each of the first side of the third conductive member 104 and the second side of the third conductive member 104.

A length of the third side of the third conductive member 104 may be less than a total length of the third conductive member 104 in a direction perpendicular to the second substrate 200 (e.g., the bottom surface of the second substrate 200 opposite the first substrate 100).

The first side of the third conductive member 104 may directly contact a first side of the first conductive member 107. The third side of the third conductive member 104 may directly contact a second side of the first conductive member 107.

The third conductive member 104 may include a conductive material portion and a diffusion barrier 1041. The conductive material portion may be formed of a first conductive material (e.g., at least one of copper, tungsten, and/or one or more other suitable materials). The diffusion barrier 1041 may be formed of a second conductive material (e.g., tantalum nitride and/or one or more other suitable materials) different from the first conductive material. The diffusion barrier 1041 may be positioned between the conductive material portion and at least one of the first conductive member 107 and the second conductive member 109. The diffusion barrier 1041 may minimize or substantially prevent unwanted diffusion of metal material.

The first conductive member 107 may include a conductive material portion and an etch-stop layer 1071. The conductive material portion may be formed of a first conductive material (e.g., aluminum and/or one or more other suitable materials). The etch-stop layer 1071 may be formed of a second conductive material (e.g., tantalum nitride and/or one or more other suitable materials) different from the first conductive material. The etch-stop layer 1071 may be positioned between the conductive material portion and the first substrate 100.

The third conductive member 104 may directly contact both the conductive material portion and the etch-stop layer 1071.

The etch-stop layer 1071 may be positioned between the conductive material portion and a portion of the third conductive member 104.

The second conductive member 109 may include a conductive material portion and an etch-stop layer 1091. The conductive material portion may be formed of a first conductive material (e.g., aluminum and/or one or more other suitable materials). The etch-stop layer 1091 may be formed of a second conductive material (e.g., tantalum nitride and/or one or more other suitable materials) different from the first conductive material. The etch-stop layer 1091 may be positioned between the conductive material portion and the third conductive member 104.

The third conductive member 104 may include a metal portion and a diffusion barrier 1041. The diffusion barrier 1041 may be positioned between the metal portion and the etch-stop layer 1091.

The semiconductor device may include one or more other elements, such as one or more of a transistor, a microelectro-mechanical system (MEMS), an integrated passive device (IPD), etc., and related interconnect structure.

According to embodiments of the invention, in the semiconductor device, two separated horizontal conductive members 107 and 109 may be electrically connected to other elements through a single vertical conductive member 104, rather than through two spaced vertical conductive members. Therefore, parasitic issues (such as undesirable RC delay and/or parasitic capacitance) in the semiconductor device may be minimized or substantially prevented. Advantageously, the performance of the semiconductor device (and a related electronic device) may be substantially satisfactory.

Figure 3:
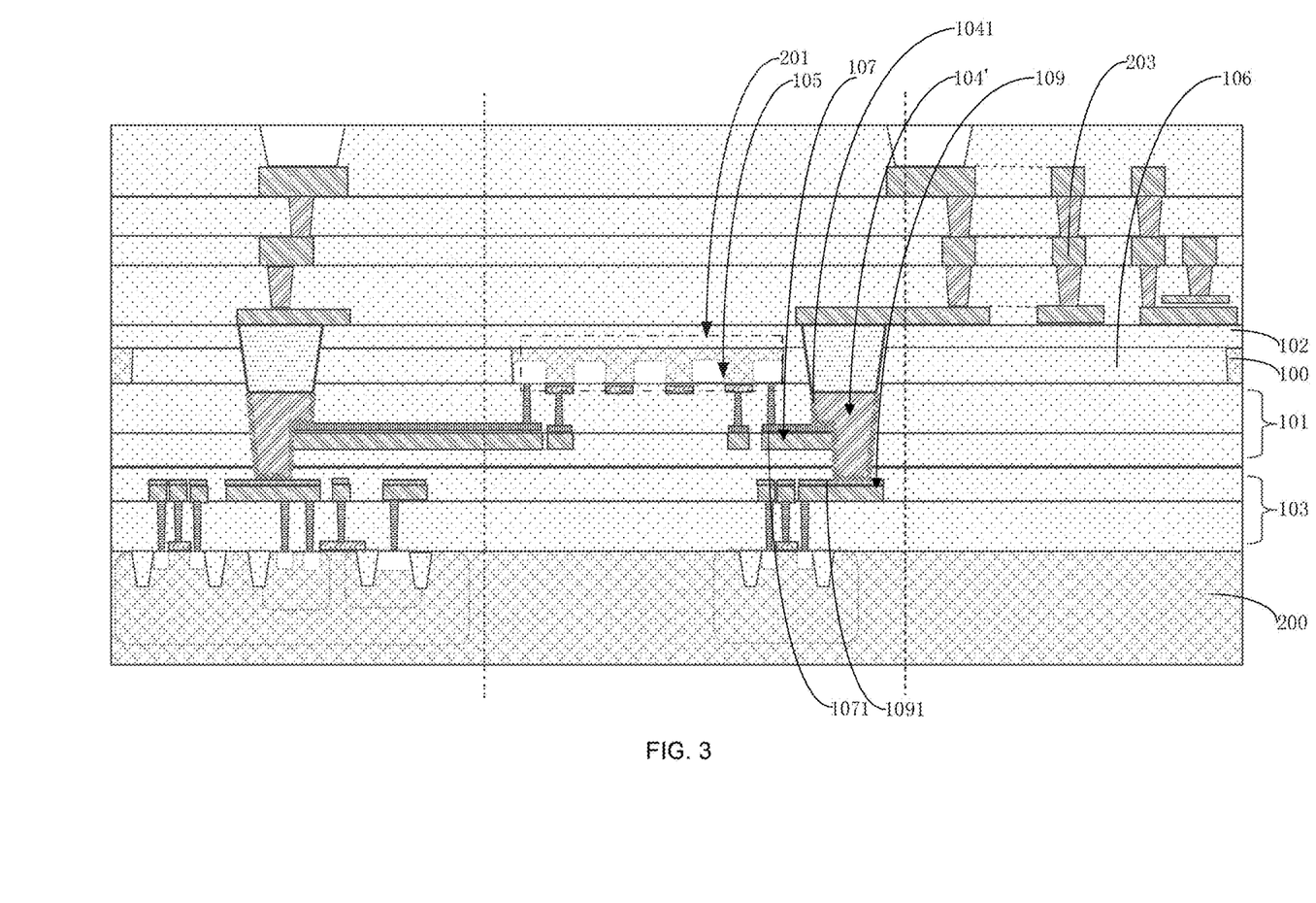
FIG. 3 shows a schematic cross-sectional view that illustrates elements and structures of a semiconductor device in accordance with one or more embodiments of the present invention.

FIG. 3 shows a schematic cross-sectional view that illustrates elements and structures of a semiconductor device in accordance with one or more embodiments of the present invention.

Some features and advantages of the semiconductor device illustrated in FIG. 3 may be identical to or analogous to some features and advantages of the semiconductor device discussed with reference to FIG. 2. For example, as illustrated in FIG. 3, an alternative third conductive member 104' may contact both the first conductive member 107 and the second conductive member 109 through the same hole of the combined dielectric layer that includes the first dielectric layer 101 and the second dielectric layer 102.

Some features and advantages of the semiconductor device illustrated in FIG. 3 may be different from some features and advantages of the semiconductor device discussed with reference to FIG. 2. For example, as illustrated in FIG. 3, the alternative third conductive member 104' may not extend into the first substrate 100 (or the first insulating member 106), and the first substrate 100 (and/or the first insulating member 106) may be positioned between the third conductive member 204 and the third dielectric layer 102. A top side of the alternative third conductive member 104' may be positioned inside the first dielectric layer 101 and may be spaced from the first substrate 100. An insulating element and/or a conductive element may directly contact the top side of the third conductive member 104 and may extend into and/or extend through the first substrate 100.

The relative shortness of the alternative third conductive member 104' may advantageously reduce unwanted antenna effects.

In an embodiment, an alternative or additional third conductive member may extend into the first substrate 100 without extending through the first substrate 100. A top side of the alternative or additional third conductive member may be positioned inside the first substrate 100 and may be spaced from the third dielectric layer 102.

FIG. 4A, FIG. 4B, FIG. 4C, and FIG. 4D show schematic cross-sectional views that illustrate structures formed in a method for manufacturing the semiconductor device in accordance with one or more embodiments of the present invention. FIG. 5 shows a flowchart that illustrates a method for manufacturing a semiconductor device, for example, a semiconductor device related to one or more of FIGS. 2, 3, 4A, 4B, 4C, and 4D, in accordance with one or more embodiments of the present invention.

Referring to FIG. 5, the method may include a step S101, a step S102, a step S103, a step S104, and a step S105.

Figure 4A:
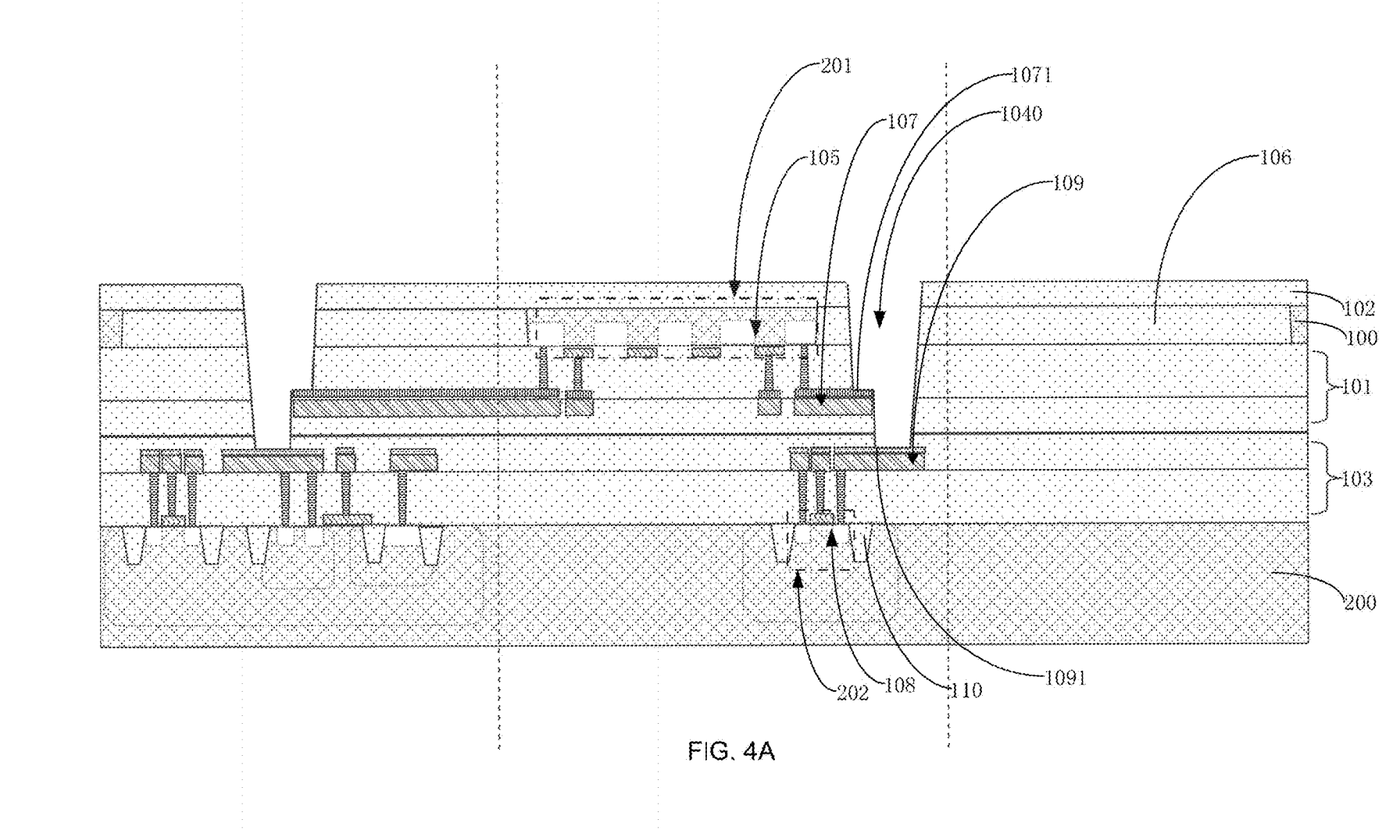
FIG. 4A, FIG. 4B, FIG. 4C, and FIG. 4D show schematic cross-sectional views that illustrate structures formed in a method for manufacturing a semiconductor device in accordance with one or more embodiments of the present invention.

Referring to FIG. 5 and FIG. 4A, the step S101 may include the following sub-steps: preparing a first substrate 100; preparing a second substrate 200; providing a first dielectric layer 101 that overlaps the first substrate 100, wherein a first conductive member 107 may be positioned in the first dielectric layer 101; and providing a second dielectric layer 103 that overlaps the second substrate 200, wherein a second conductive member 109 may be positioned in the second dielectric layer 103. The step S101 may further include providing a third dielectric layer 102 that overlaps the first substrate 100.

One or more of the first substrate 100, the second substrate 200, the first dielectric layer 101, the second dielectric layer 103, the third dielectric layer 102, the first conductive member 107, and the second conductive member 109 may have one or more features discussed above with reference to FIG. 2.

The method may include forming the first conductive member 107 such that the first conductive member 107 may include the first conductive member 107 a conductive material portion and an etch-stop layer 1071. The conductive material portion may be formed of a first conductive material (e.g., aluminum and/or one or more other suitable materials). The etch-stop layer 1071 may be formed of a second conductive material (e.g., tantalum nitride and/or one or more other suitable materials) different from the first conductive material. The etch-stop layer 1071 may be positioned between the conductive material portion and the first substrate 100 after the bonding.

The method may include forming the second conductive member 109 such that the second conductive member 109 may include a conductive material portion and an etch-stop layer 1091. The conductive material portion may be formed of a first conductive material (e.g., aluminum and/or one or more other suitable materials). The etch-stop layer 1091 may be formed of a second conductive material (e.g., tantalum nitride and/or one or more other suitable materials) different from the first conductive material.

Referring to FIG. 5 and FIG. 4A, the step S102 may include bonding the first dielectric layer 101 and the second dielectric layer 103 to each other, e.g., through one or more wafer-bonding processes, to form a combined dielectric layer.

Referring to FIG. 5 and FIG. 4A, the step S103 may include forming (e.g., through etching) a hole 1040 in the combined dielectric layer, such that the hole 1040 may expose a portion of the first conductive member 107 and may expose a portion of the second conductive member 109.

Figure 4B:
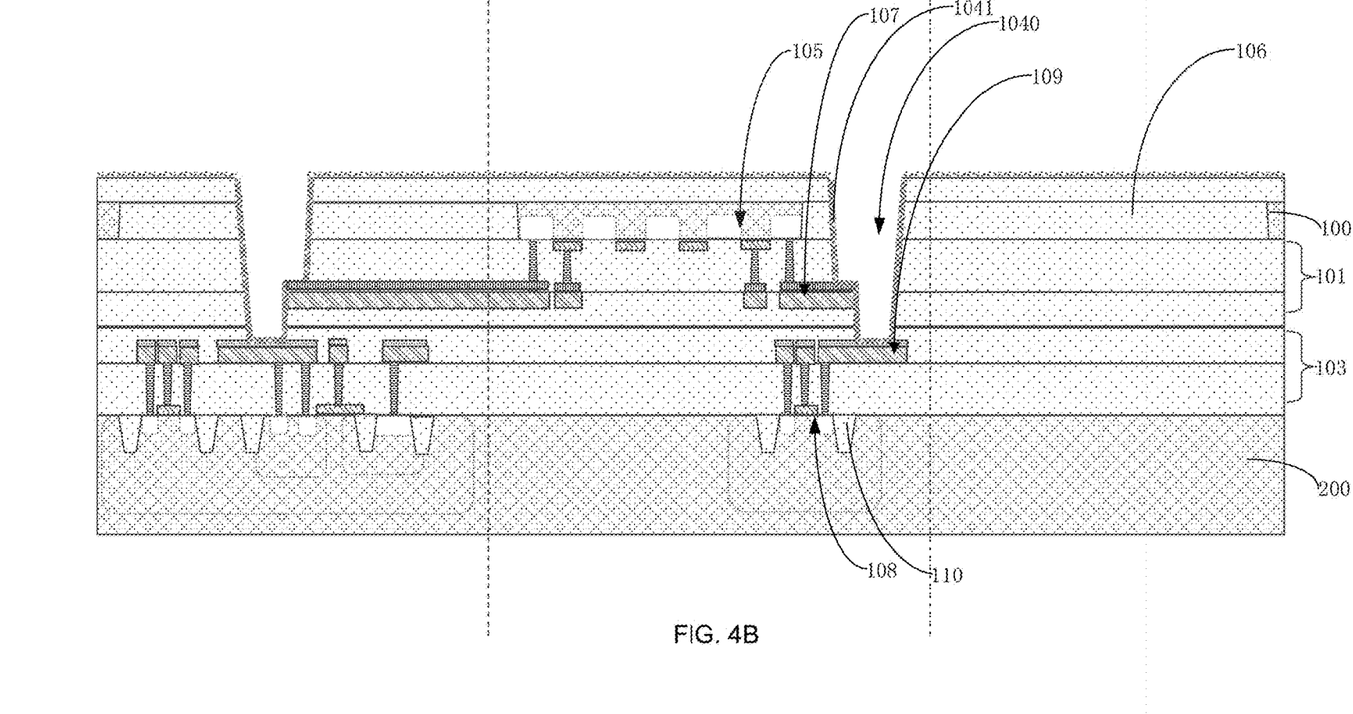

Referring to FIG. 5 and FIG. 4B, the step S104 may include providing a diffusion barrier material (e.g., tantalum nitride and/or one or more other suitable materials) in the hole 1040 to form a diffusion barrier 1041. The diffusion barrier 1041 may cover an inner side surface of the hole 1040 and may cover the exposed portions of the conductive members 107 and 109. The diffusion barrier material may also overlap (and cover) the third dielectric layer 102 and/or the first substrate 100.

Figure 4C:
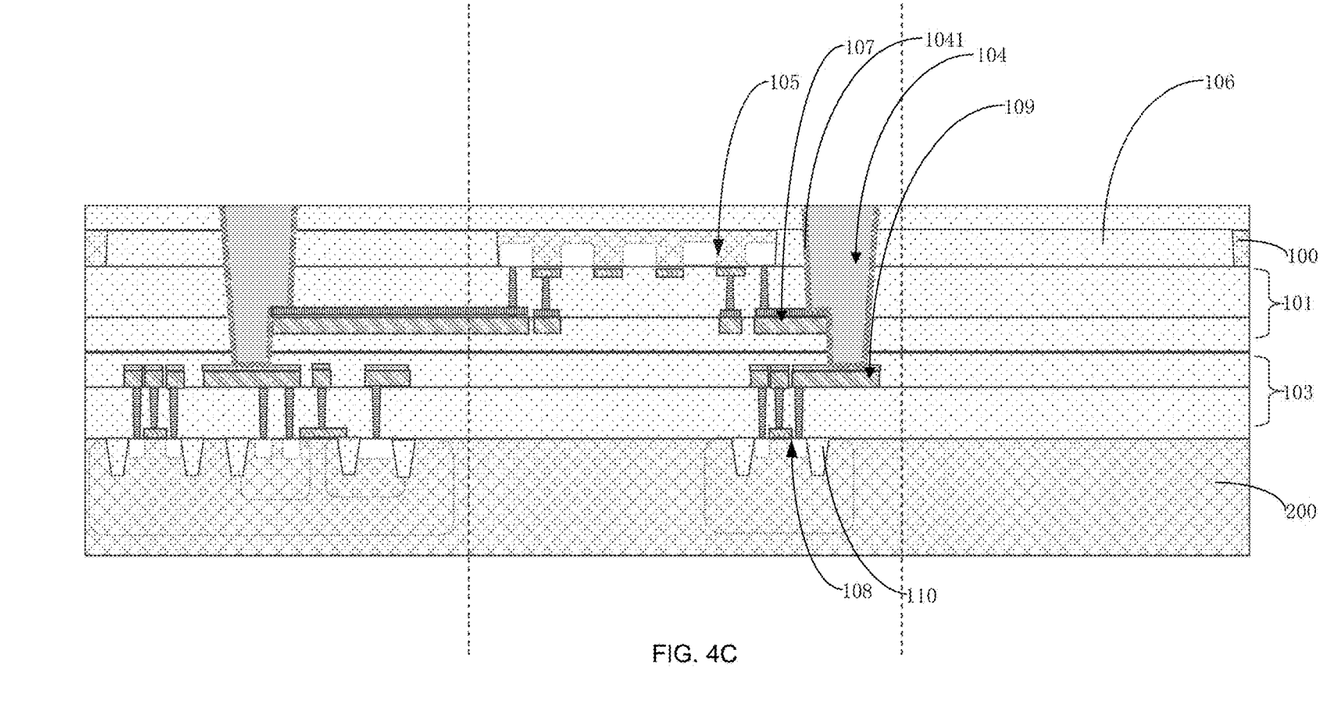

Referring to FIG. 5 and FIG. 4C, the step S105 may include providing a conductive material (e.g., copper, tungsten, and/or one or more other suitable materials) in the hole to form a third conductive member 104. The third conductive member 104 may include the conductive material and the diffusion barrier 1041 and may directly contact both the portion of the first conductive member 107 and the portion of the second conductive member 109 through the hole 1040.

The formation of the third conductive member 104 may include metal plating and/or one or more other suitable processes.

The formation of the third conductive member 104 may include forming (e.g., through physical vapor deposition) a conductive seed film on the barrier layer 1041 for facilitating subsequent electroplating. The conductive seed film may be formed of, for example, copper and/or one or more other suitable materials.

A first side of the third conductive member 104 may directly contact the first conductive member 107. A second side of the third conductive member 104 may directly contact the second conductive member 109. A third side of the third conductive member 104 may be positioned inside the combined dielectric layer and may be directed connected to each of the first side of the third conductive member 104 and the second side of the third conductive member 104.

A length of the third side of the third conductive member 104 may be less than a total length of the third conductive member 104 in a direction perpendicular to the second substrate 200.

The first side of the third conductive member 104 may directly contact a first side of the first conductive member 107. The third side of the third conductive member 104 may directly contact a second side of the first conductive member 107.

The third conductive member 104 may be formed to contact both the conductive material portion and the etch-stop layer 1071.

The third conductive member 104 may be formed such that the etch-stop layer 1071 may be positioned between the conductive material portion and a portion of the third conductive member 104.

The third conductive member 104 may be formed such that the third conductive member 104 may include a diffusion barrier 1041 and such that the etch-stop layer 1091 may be positioned between the conductive material portion and the diffusion barrier 1041.

Figure 4D:
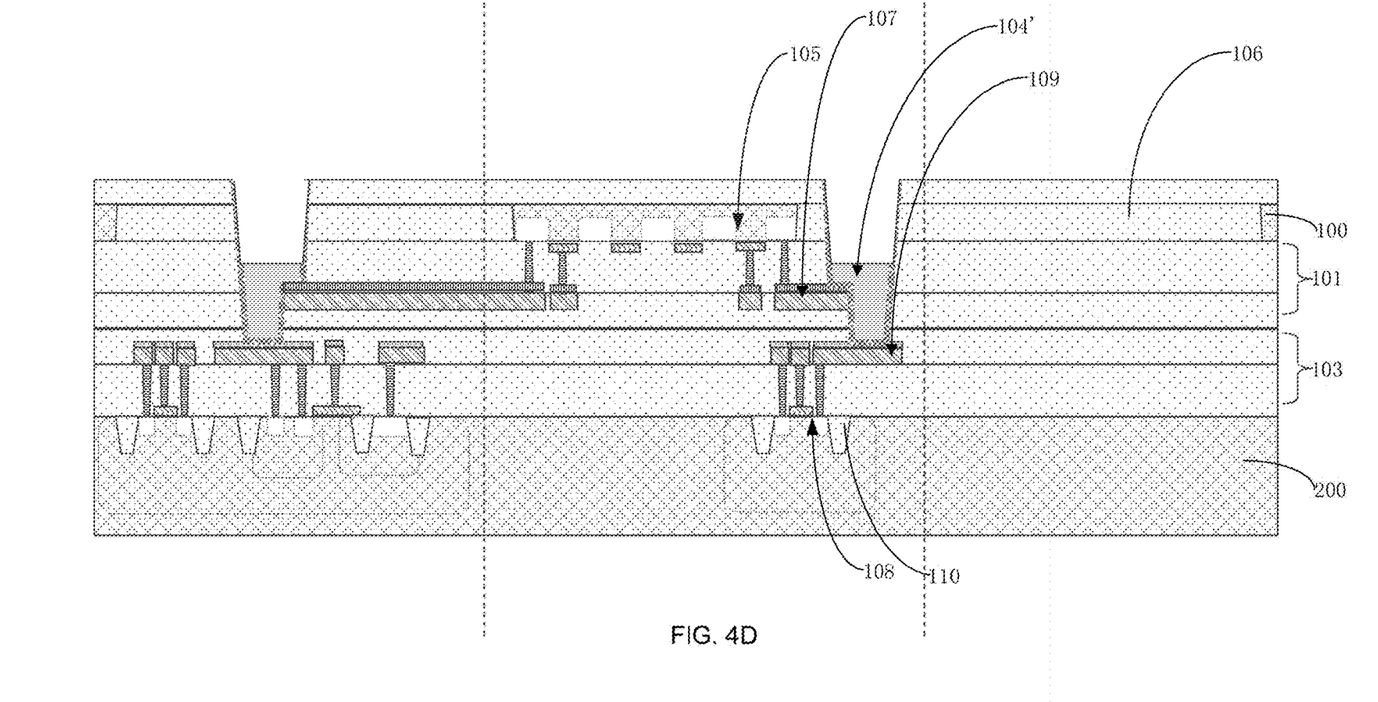

Referring to FIG. 4D, the method may further include removing (e.g., through etching) a portion of the third conductive member 104 to form an alternative third conductive member 104' with a reduced length. The alternative third conductive member 104' may have one or more features discussed above with reference to at least one of FIG. 2 and FIG. 3.

An embodiment of the invention may be related to an electronic device. The electronic device may include a semiconductor device that may have one or more features and advantages analogous to or identical to one or more features and advantages discussed above with reference to one or more of FIG. 2, FIG. 3, FIG. 4A, FIG. 4B, FIG. 4C, and FIG. 4D.

The electronic device may be or may include one or more of a mobile phone, a tablet computer, a notebook computer, a netbook, a game console, a television, a video compact disc (VCD) player, a digital video disc (DVD) player, a navigation device, a camera, a camcorder, a voice recorder, an MP3 player, an MP4 player, a portable game device, etc.

The electronic device may be or may include an intermediate product (e.g., a mobile phone main board) or module including a semiconductor device that may have one or more of the features and advantages discussed above.

According to embodiments of the invention, in a semiconductor device, two separated horizontal conductive members may be electrically connected to other elements through a single vertical conductive member, rather than through two spaced vertical conductive members. Therefore, parasitic issues in the semiconductor device may be minimized or substantially prevented. Advantageously, the performance of the semiconductor device (and a related electronic device) may be substantially satisfactory.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A method for manufacturing a semiconductor device, comprising:
   providing a first substrate;
   providing a second substrate;
   providing a first dielectric layer that overlaps the first substrate, wherein a first conductive member is positioned in the first dielectric layer, the first conductive member including:
   a conductive material portion, and
   a first etch-stop layer, formed over the conductive material portion by a conductive material different from the conductive material portion;
   providing a second dielectric layer that overlaps the second substrate, wherein a second conductive member is positioned in the second dielectric layer;
   bonding the first dielectric layer and the second dielectric layer to each other to form a combined dielectric layer;
   forming a hole in the combined dielectric layer, such that the hole exposes a portion of the first conductive member and exposes a portion of the second conductive member; and
   providing at least a conductive material in the hole to form a third conductive member, such that the third conductive member has a first side directly contacting a portion of a top surface of the first etch-stop layer of the first conductive member, has a second side directly contacting a portion of a top surface of the second conductive member, and has a third side directly contacting a sidewall of each of the first etch-stop layer and the conductive material portion of the first conductive member.

2. The method of claim 1, wherein the third side of the third conductive member is positioned inside the combined dielectric layer and is directly connected to each of the first side of the third conductive member and the second side of the third conductive member.

3. The method of claim 2, wherein a length of the third side of the third conductive member is less than a total length of the third conductive member in a direction perpendicular to a top surface of the second substrate.

4. The method of claim 1, further comprising:
   providing a diffusion barrier material in the hole to form a diffusion barrier,
   wherein
   the conductive material is subsequently provided to form a conductive material portion, and
   the third conductive member includes the conductive material portion and the diffusion barrier.

5. The method of claim 1, further comprising:
   the first etch-stop layer is positioned between the conductive material portion and the first substrate after the bonding.

6. The method of claim 5, wherein the third conductive member is formed such that the first etch-stop layer is positioned between the conductive material portion and a portion of the third conductive member.

7. The method of claim 1, further comprising:
   forming the second conductive member such that the second conductive member includes a second conductive material portion and a second etch-stop layer over the second conductive material portion,
   wherein
   the second conductive material portion is formed of a first conductive material,
   the second etch-stop layer is formed of a second conductive material different from the first conductive material, and
   the third conductive member is formed such that the third conductive member includes a diffusion barrier and such that the second etch-stop layer is positioned between the second conductive material portion and the diffusion barrier.

8. The method of claim 1, wherein:

the first and second conductive members are separated from each other by a portion of the first dielectric layer and a portion of the second dielectric layer, in a direction perpendicular to a top surface of one of the first and second substrates.

9. The method of claim 8, wherein:

a portion of the third conductive member passes through the portion of the first dielectric layer and the portion of the second dielectric layer, that are between the first and second conductive members, in the direction perpendicular to the top surface of one of the first and second substrates.

10. The method of claim 1, wherein:

the third conductive member has a top surface lower than an interface of the first dielectric layer with the first substrate.

11. The method of claim 1, wherein:

the third side of the third conductive member directly contacts an entire sidewall of the first conductive member.

* * * * *